US012743033B2

(12) United States Patent
Shibasaki et al.

(10) Patent No.: US 12,743,033 B2
(45) Date of Patent: Sep. 22, 2026

(54) SOLUTION TREATMENT APPARATUS AND CLEANING METHOD

(71) Applicant: Tokyo Electron Limited, Tokyo (JP)

(72) Inventors: Kenta Shibasaki, Koshi City (JP); Hiroichi Inada, Koshi City (JP); Satoshi Shimmura, Koshi City (JP); Koji Takayanagi, Koshi City (JP); Kenji Yada, Koshi City (JP); Shinichi Seki, Koshi City (JP); Akihiro Teramoto, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 357 days.

(21) Appl. No.: 18/515,667

(22) Filed: Nov. 21, 2023

(65) Prior Publication Data

US 2024/0085813 A1 Mar. 14, 2024

Related U.S. Application Data

(62) Division of application No. 17/485,698, filed on Sep. 27, 2021, now Pat. No. 11,868,057.

(30) Foreign Application Priority Data

Oct. 8, 2020 (JP) ................................ 2020-170375

(51) Int. Cl.
*G03F 7/00* (2006.01)
*B05C 1/02* (2006.01)
(Continued)

(52) U.S. Cl.
CPC ............ *G03F 7/70925* (2013.01); *B05C 1/02* (2013.01); *B05C 11/02* (2013.01); *B08B 3/08* (2013.01); *G03F 7/162* (2013.01)

(58) Field of Classification Search
None
See application file for complete search history.

(56) References Cited

U.S. PATENT DOCUMENTS 5,180,431 A 1/1993 Sugimoto et al.
6,432,199 B1 * 8/2002 Takekuma .............. B05C 11/08 118/319

(Continued)

FOREIGN PATENT DOCUMENTS

JP H04-200673 A 7/1992
JP 2008-277708 A 11/2008

(Continued)

*Primary Examiner* — Kaj K Olsen
*Assistant Examiner* — Arlyn I Rivera-Cordero
(74) *Attorney, Agent, or Firm* — Posz Law Group, PLC

(57) ABSTRACT

A cleaning method of cleaning a solution treatment apparatus for applying a coating solution onto a substrate, the solution treatment apparatus including a holder holding and rotating the substrate; a coating solution supplier; and an inner cup surrounding the holder from a lateral side and having a peripheral edge side upper surface inclining down outward in a radial direction. The cleaning method includes introducing the cleaning solution to the storage chamber via the introduction hole, discharging the cleaning solution from the discharge port and making the cleaning solution flow down along the peripheral edge side upper surface of the inner cup, thereby cleaning away the coating solution adhering to the peripheral edge side upper surface. The discharging in the cleaning discharges the cleaning solution from discharge ports of the inner cup outward in the radial direction and obliquely upward.

18 Claims, 19 Drawing Sheets

(51) Int. Cl.

| | |
|---|---|
| ***B05C 11/02*** | (2006.01) |
| ***B08B 3/08*** | (2006.01) |
| ***G03F 7/16*** | (2006.01) |

(56) References Cited

U.S. PATENT DOCUMENTS

| | | | |
|---|---|---|---|
| 8,186,298 B2 | 5/2012 | Ogata et al. | |
| 2008/0280054 A1* | 11/2008 | Ogata | H01L 21/67051 134/33 |
| 2014/0261163 A1 | 9/2014 | Kishita et al. | |

FOREIGN PATENT DOCUMENTS

| | | |
|---|---|---|
| JP | 2010-225626 A | 10/2010 |
| JP | 2012-033886 A | 2/2012 |
| JP | 2019-046833 A | 3/2019 |

* cited by examiner

FIG.9

NITROGEN GAS SUPPLY FLOW RATE
0

CLEANING SOLUTION SUPPLY FLOW RATE
0

TIME

FIG.10

NITROGEN GAS SUPPLY FLOW RATE

0

CLEANING SOLUTION SUPPLY FLOW RATE

0

TIME

SOLUTION TREATMENT APPARATUS AND CLEANING METHOD

CROSS REFERENCE TO RELATED APPLICATIONS

This application is a divisional application of U.S. Utility Application Ser. No. 17/485,698 filed on Sep. 27, 2021, now issued as U.S. Pat. No. 11,868,057, which is based upon and claims the benefit of priority of the prior Japanese Patent Application No. 2020-170375, filed in Japan on Oct. 8, 2020, the entire contents of which are incorporated herein by reference.

TECHNICAL FIELD

This disclosure relates to a solution treatment apparatus and a cleaning method.

BACKGROUND

Japanese Laid-open Patent Publication No. 2019-46833 discloses an apparatus that performs spin coating of supplying each coating solution such as a resist to the surface of a semiconductor wafer (hereinafter, referred to a “wafer”) and rotating the wafer to thereby apply the coating solution over the entire surface of the wafer.

Japanese Laid-open Patent Publication No. 2012-33886 discloses a coating treatment apparatus including a spin chuck which suction-holds the wafer, a shaft to which the spin chuck is attached, a cup base which is provided to surround the shaft, and a guide ring which is provided at the outer peripheral portion of the cup base and has a sectional shape in a chevron shape. The coating treatment apparatus is further provided with a cup in a manner to surround the wafer held on the spin chuck and the guide ring. The cup can receive and collect liquid scattered or dropped off from the wafer. Further, Japanese Laid-open Patent Publication No. 2012-33886 discloses that a rinse solution is supplied from a rinse solution discharge port formed at the upper end portion of the guide ring into the cup to clean the inside of the cup.

SUMMARY

An aspect of this disclosure is a solution treatment apparatus for applying a coating solution onto a substrate, including: a holder configured to hold and rotate the substrate; a coating solution supplier configured to supply the coating solution to the substrate held on the holder; and an inner cup configured to surround the holder from a lateral side and having a peripheral edge side upper surface inclining down outward in a radial direction from an apex part located below a peripheral edge side of the substrate held on the holder, wherein: the inner cup has a plurality of discharge ports formed along a circumferential direction at the apex part; and the discharge ports are formed to discharge a cleaning solution and make the cleaning solution flow down along the peripheral edge side upper surface of the inner cup to which the coating solution adheres, thereby cleaning the peripheral edge side upper surface, and to discharge the cleaning solution outward in the radial direction and obliquely upward.

BRIEF DESCRIPTION OF THE DRAWINGS

FIG. 9 is a timing chart for explaining a supply example of the cleaning solution and a nitrogen gas.

FIG. 10 is a timing chart for explaining a supply example of the cleaning solution and the nitrogen gas.

DETAILED DESCRIPTION OF THE INVENTION

Figure 1:
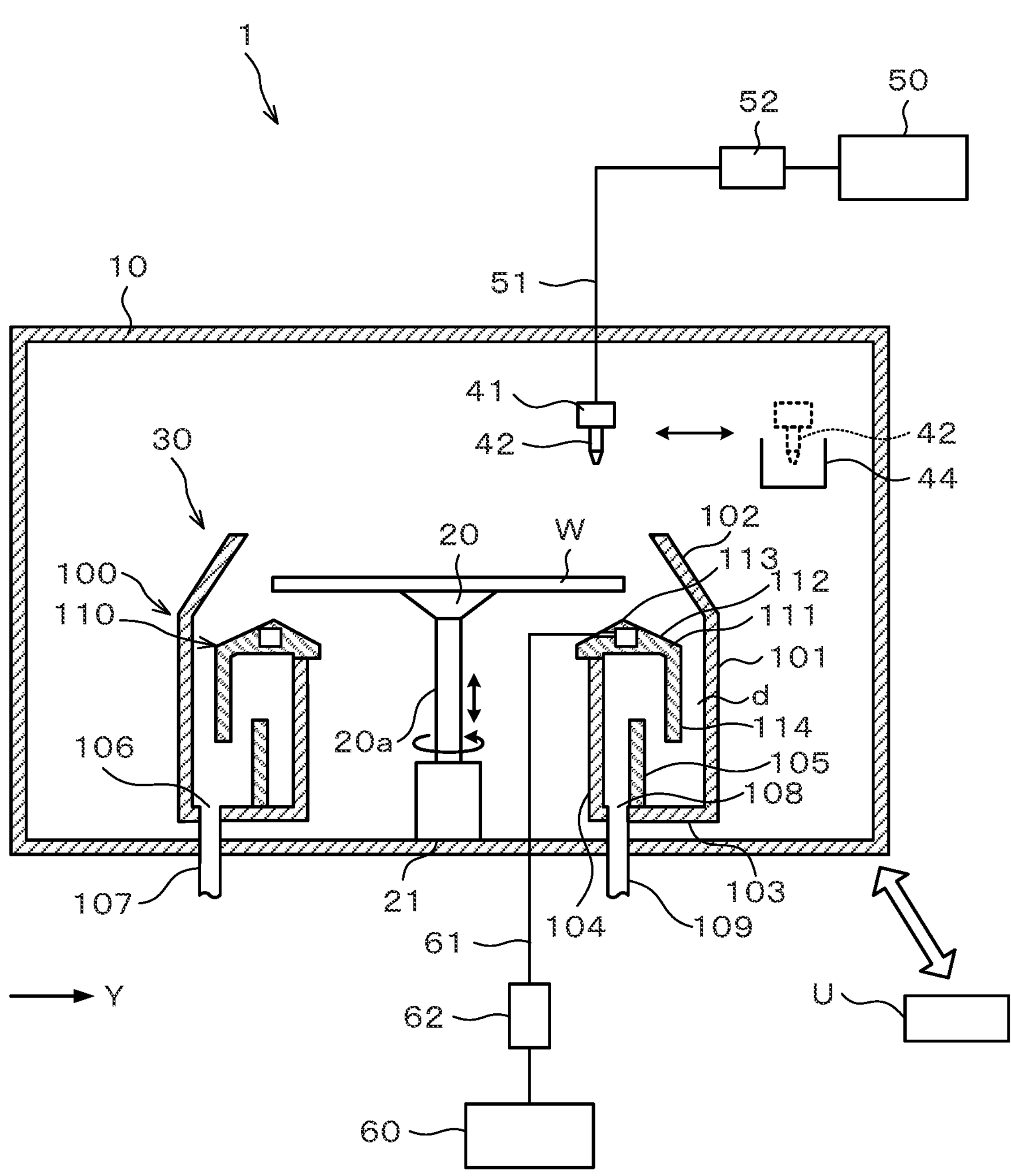
FIG. 1 is a longitudinal sectional view schematically illustrating the configuration of a resist coating apparatus as a solution treatment apparatus according to a first embodiment.

For example, at a photolithography step in a manufacturing process of a semiconductor device, a coating treatment of applying a coating solution onto a substrate such as a wafer to form a coating film is performed.

For the above coating treatment, a so-called spin coating of supplying the coating solution from a nozzle to the rotated substrate to apply the coating solution to the whole substrate by the centrifugal force is widely used (refer to Japanese Laid-open Patent Publication No. 2019-46833, Japanese Laid-open Patent Publication No. 2012-33886).

Some solution treatment apparatuses for performing the spin coating include the following substrate holder, outer cup, and inner cup. The substrate holder is intended to hold and rotate the substrate, and the outer cup is intended to surround the periphery of the substrate held on the substrate holder. Besides, the inner cup is provided inside the outer cup and intended to surround the substrate holder from the lateral side, and its peripheral edge side upper surface is an inclined surface inclining down outward in the radial direction. In this solution treatment apparatus, the coating solution scattered or dropped from the substrate is received and collected by the outer cup or receive by the inner cup, and then flows along the inclined surface of the peripheral edge side upper surface of the inner cup and drops into the outer cup and is collected.

If the coating solution is not collected but remains while adhering to the outer cup or the inner cup, the coating solution causes particles or the like and therefore needs to be removed by cleaning.

By supplying the cleaning solution into the outer cup from the discharge port formed at the upper end portion of the inner cup as in the disclosure of Japanese Laid-open Patent Publication No. 2012-33886, the inside of the outer cup is cleaned. Further, it is considered that by supplying the cleaning solution from the discharge port, the peripheral edge side upper surface of the inner cup is also cleaned.

Incidentally, in recent years, it is required to form a coating film with a large film thickness on the substrate using a coating solution such as a resist solution having high viscosity in some cases. In the case where the coating solution has high viscosity as above, a larger amount of the coating solution dropped from the substrate remains on the peripheral edge side upper surface of the inner cup as compared with the case where the coating solution has low viscosity. According to the earnest study by the present inventors, in the case where the coating solution has high viscosity, even if the cleaning solution is supplied from the discharge port formed at the upper end portion of the guide ring to perform cleaning as in the disclosure of Japanese Laid-open Patent Publication No. 2012-33886, the coating solution adhering to the peripheral edge side upper surface of the inner cup may remain even after the cleaning.

Hence, the technique according to this disclosure appropriately removes the coating solution adhering to the inner cup by cleaning.

Hereinafter, a solution treatment apparatus and a cleaning method according to the embodiments will be explained referring to the drawings. Note that the same codes are given to components having substantially the same functional configurations in the description and the drawings to omit duplicated explanation.

First Embodiment

Figure 2:
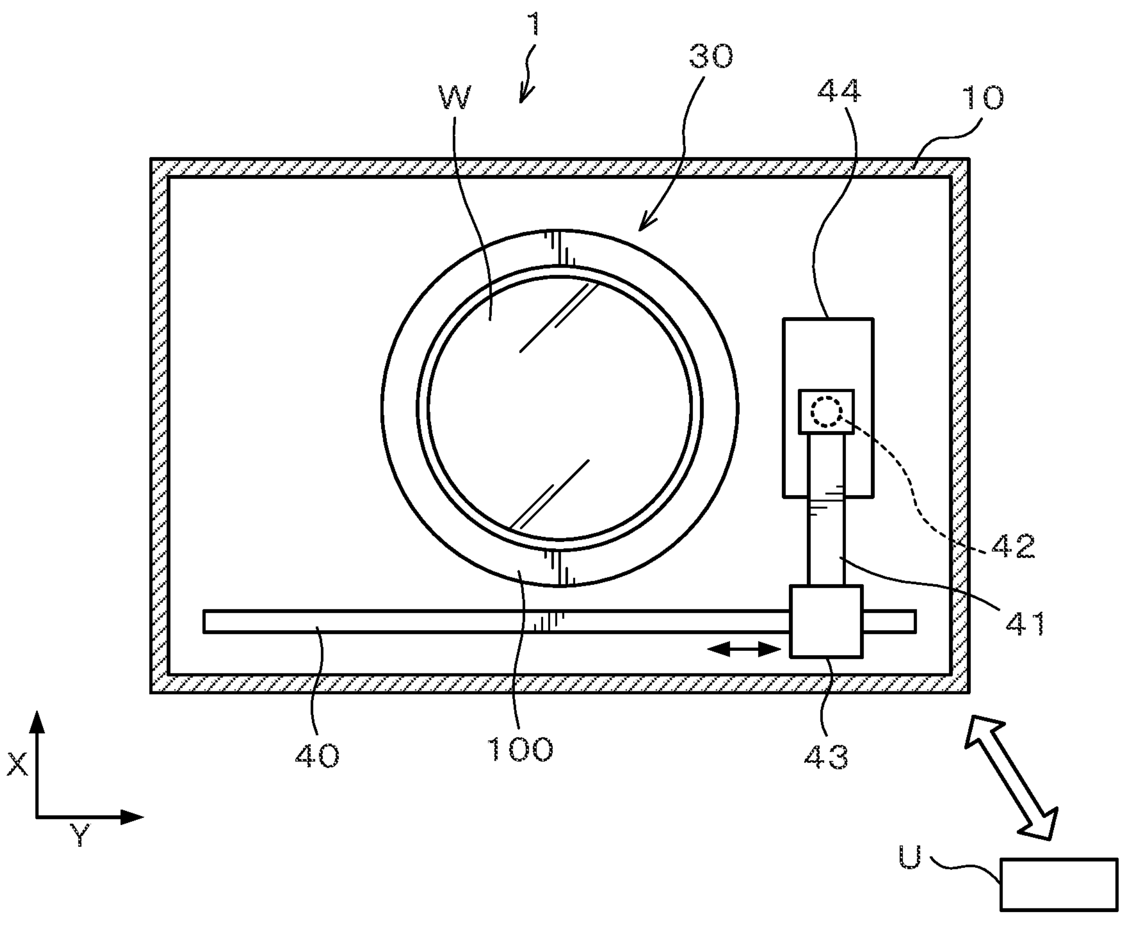
FIG. 2 is a transverse sectional view schematically illustrating the configuration of the resist coating apparatus as the solution treatment apparatus according to the first embodiment.

FIG. 1 and FIG. 2 are a longitudinal sectional view and a transverse sectional view schematically illustrating the configuration of a resist coating apparatus as a solution treatment apparatus according to a first embodiment, respectively.

A resist coating apparatus 1 has a housing 10 whose inside can be hermetically closed as illustrated in FIG. 1 and FIG. 2. A side surface of the housing 10 is formed with a transfer-in/out port (not illustrated) for the wafer W.

In the housing 10, a spin chuck 20 is provided as a holder which holds and rotates the wafer W. The spin chuck 20 can rotate at a predetermined speed by a chuck drive 21 having, for example, an actuator such as a motor. The chuck drive 21 is further provided with, for example, a raising and lowering drive mechanism having, for example, an actuator such as a cylinder so that the spin chuck 20 can rise and lower.

Further, in the housing 10, a cup 30 is provided which houses the spin chuck 20 and from which air is exhausted from a bottom part. The cup 30 receives the coating solution shaken off or dropped off from the wafer W held on the spin chuck 20 and guides the coating solution in order to drain the coating solution to the outside of the resist coating apparatus 1. The details of the cup 30 will be explained later.

As illustrated in FIG. 2, on an X-direction negative direction (lower direction in FIG. 2) side of the cup 30, a rail 40 is formed which extends along a Y-direction (right-left direction in FIG. 2). The rail 40 is formed, for example, from a Y-direction negative direction (left direction in FIG. 2) side outer position to a Y-direction positive direction (right direction in FIG. 2) side outer position of the cup 30. On the rail 40, an arm 41 is provided.

On the arm 41, a discharge nozzle 42 as a coating solution supplier is supported. The discharge nozzle 42 discharges a resist solution as the coating solution and supplies it to the wafer W held on the spin chuck 20. The viscosity of the resist solution supplied by the discharge nozzle 42 is, for example, 50 cP to 1000 cP. The arm 41 is movable on the rail 40 by a nozzle drive 43 having, for example, an actuator such as a motor. This allows the discharge nozzle 42 to move from a waiting section 44 provided at a Y-direction positive direction side outer position of the cup 30 to above a central portion of the wafer W in the cup 30. Further, the nozzle drive 43 enables the arm 41 to freely rise and lower and can adjust the height of the discharge nozzle 42.

To the discharge nozzle 42, a supply pipe 51 communicating with a supply source 50 storing the resist solution is connected. The supply pipe 51 is provided with a supply equipment group 52 including a valve for controlling the flow of the resist solution, a flow regulator for regulating the flow rate of the resist solution, and so on.

Further, in the resist coating apparatus 1, a supply pipe 61 communicating with a supply source 60 storing a cleaning solution for cleaning the cup 30 is connected to the cup 30. The supply pipe 61 is concretely connected to an introduction hole of a later-explained inner cup of the cup 30. The supply pipe 61 is provided with a supply equipment group 62 including a valve for controlling the flow of the cleaning solution, a flow regulator for regulating the flow rate of the cleaning solution, and so on.

The resist coating apparatus 1 is further provided with a controller U. The controller U is, for example, a computer including a CPU, a memory and so on, and includes a program storage (not illustrated). The program storage also stores programs for controlling the above-explained nozzle drive 43, supply equipment group 52, supply equipment group 62 and so on to realize the later-explained resist film forming treatment and cleaning treatment. Note that the above programs may be the ones which are recorded in a computer-readable storage medium and installed from the storage medium into the controller U. The storage medium may be transitory or non-transitory. Some or all of the programs may be realized by dedicated hardware (circuit board).

Figure 3:
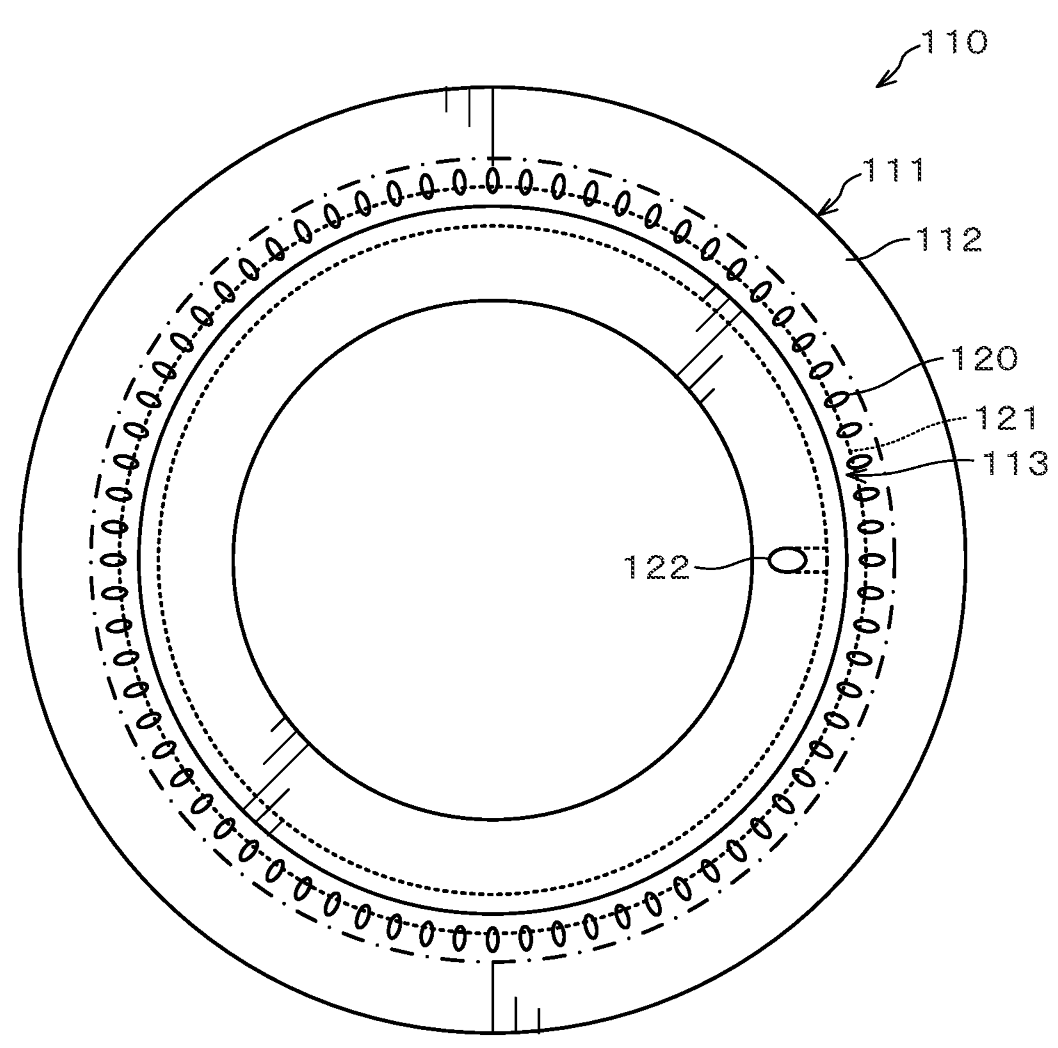
FIG. 3 is a plan view illustrating the outline of the configuration of a cup.
Figure 4:
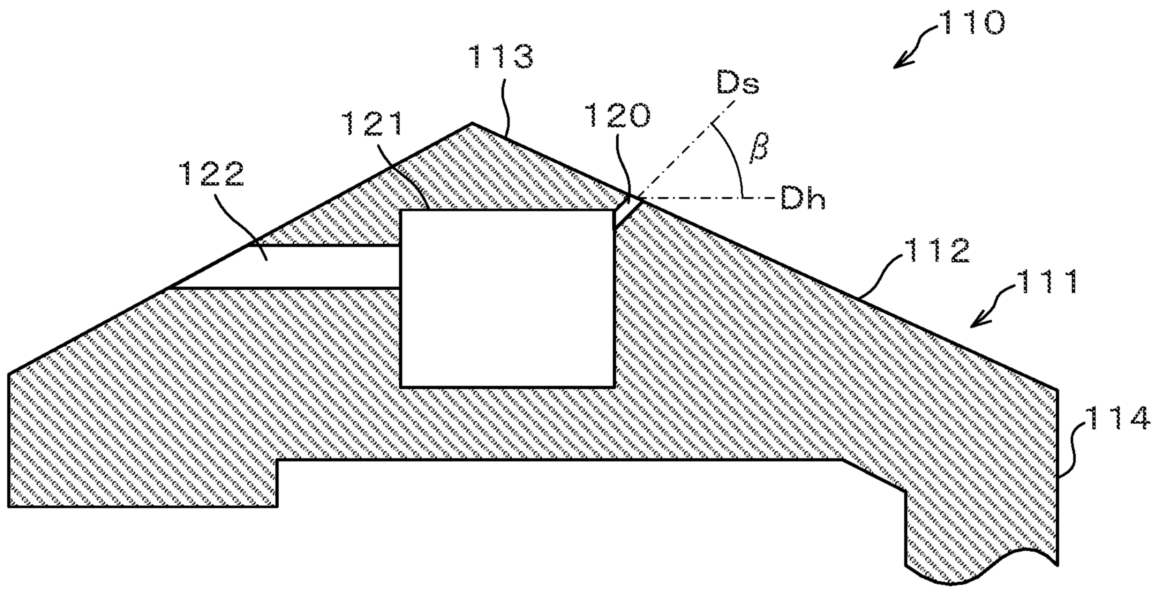
FIG. 4 is a partially enlarged view illustrating the outline of the configuration of the cup.
Figure 5:
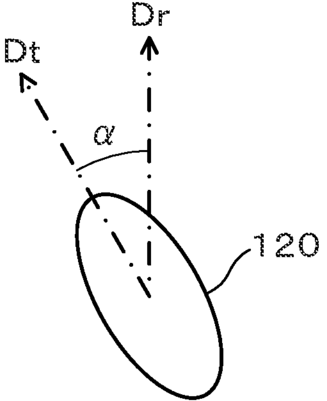
FIG. 5 is a view for explaining an example of a discharge direction of a cleaning solution from a discharge port in plan view.
Figure 6:
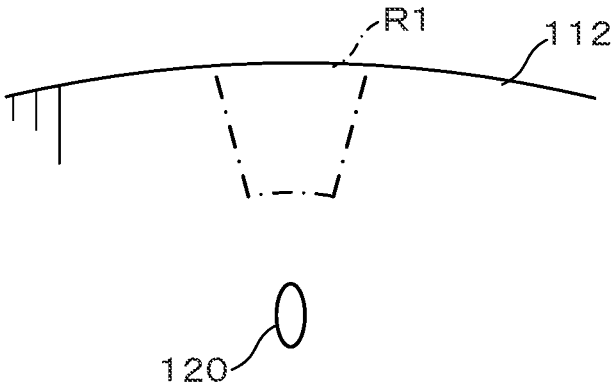
FIG. 6 is a view for explaining the reason why the discharge direction of the cleaning solution from the discharge port is set to be obliquely upward.
Figure 7:
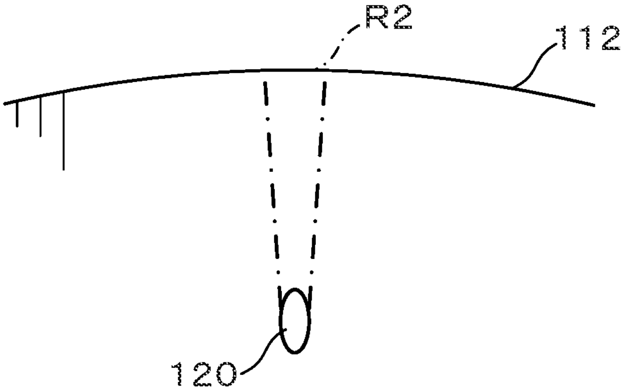
FIG. 7 is a view for explaining the reason why the discharge direction of the cleaning solution from the discharge port is set to be obliquely upward.

Next, the cup 30 will be explained using FIG. 3 to FIG. 7 referring to FIG. 1. FIG. 3 and FIG. 4 are a plan view and a partially enlarged view illustrating the outline of the configuration of the cup 30. FIG. 5 is a view for explaining an example of a direction in which the cleaning solution is discharged from a later-explained discharge port in plan view. FIG. 6 and FIG. 7 are views for explaining the reason why a direction in which the cleaning solution is discharged from the later-explained discharge port is set to be obliquely upward.

The cup 30 has, as illustrated in FIG. 1, an outer cup 100 surrounding the periphery of the wafer W held on the spin chuck 20, and an inner cup 110 provided at a position that is a position inside the outer cup 100 and below the wafer W held on the spin chuck 20 to surround a shaft part 20*a* of the spin chuck 20 from the lateral side.

The outer cup 100 has a cylindrical outer peripheral wall 101, an inclined wall 102 obliquely extending over the entire circumference from the upper end of the outer peripheral wall 101 upward to the inner side, and a bottom wall 103 in a circular shape in plan view horizontally extending over the entire circumference from the lower end of the outer peripheral wall 101 toward the inner side. Further, the outer cup 100 has a cylindrical inner peripheral wall 104 vertically extending upward from the inner peripheral end of the bottom wall 103, and a cylindrical intermediate wall 105 vertically extending upward from a position at the bottom wall 103 between the outer peripheral wall 101 and the inner peripheral wall 104.

At a position at the bottom wall 103 between the outer peripheral wall 101 and the intermediate wall 105, a drain port 106 is formed which drains the liquid collected by the cup 30, and a drain pipe 107 is connected to the drain port 106.

Further, to a position at the bottom wall 103 between the intermediate wall 105 and the inner peripheral wall 104, an exhaust port 108 is formed which exhausts the atmosphere around the wafer W, and an exhaust pipe 109 is connected to the exhaust port 108.

The inner cup 110 has a guide part 111 in a circular shape in plan view formed in a chevron shape in cross sectional view over the entire circumference. A peripheral edge side upper surface 112 of the guide part 111 is an inclined surface inclining down outward in the radial direction from an apex part 113 located below the peripheral edge side of the wafer W held on the spin chuck 20. Hereinafter, the peripheral edge side upper surface 112 is sometimes called an inclined surface 112. Note that the "radial direction" is a radial direction around the center axis of the cup 30 which coincides with the rotation axis of the spin chuck 20, the center axis of the outer cup 100, and the center axis of the inner cup 110, and this also applies to the following explanation. The guide part 111 is supported by the inner peripheral wall 104 of the outer cup 100, and thereby the inner cup 110 is supported in the outer cup 100.

Further, the inner cup 110 has a cylindrical vertical wall 114 vertically extending downward from the outer peripheral end of the guide part 111. The vertical wall 114 is located between the outer peripheral wall 101 of the outer cup 100 and the intermediate wall 105.

Between the vertical wall 114 and the outer peripheral wall 101 of the outer cup 100, a gap forming an exhaust path d is formed. Further, the vertical wall 114, the bottom wall 103, the intermediate wall 105, the guide part 111, and the inner peripheral wall 104 form a bent path. The bent path constitutes a gas/liquid separation part.

In the cup 30, the coating solution splashed or dropped from the wafer W is received and collected by the outer cup 100 or received by the inclined surface 112 of the inner cup 110, then flows along the inclined surface 112, and drops into the outer cup 100 and is collected.

Further, as illustrated in FIG. 3 and FIG. 4, the inner cup 110 is formed with a discharge port 120 for discharging the cleaning solution. As the cleaning solution, for example, a thinner being a solvent for the resist solution is used.

A plurality of discharge ports 120 are formed along the circumferential direction at the apex part 113 of the inner cup 110. More specifically, the discharge port 120 is formed at a predetermined interval along the circumferential direction such that its tip is located above the inclined surface 112. Note that the "circumferential direction" is a circumferential direction around the center axis of the cup 30 which coincides with the rotation axis of the spin chuck 20, the center axis of the outer cup 100, and the center axis of the inner cup 110, and this also applies to the following explanation.

The total number of the discharge ports 120 is 100 to 300. Each discharge port 120 is located on the outside of the outer edge of the spin chuck 20 in plan view.

Further, a flow path constituting each discharge port 120 is, for example, in a columnar shape.

Further, the thickness of the flow path constituting the discharge port 120 is, for example, common among the discharge ports 120.

Further, inside the guide part 111 of the inner cup 110, a storage chamber 121 communicating with each discharge port 120 is provided. One storage chamber 121 is provided in a circular shape along the circumferential direction. The storage chamber 121 may be partitioned into a plurality of (for example, two to five) pieces along the circumferential direction as long as the number of partitions is less than the total number of the discharge ports 120.

Further, to the inner cup 110, an introduction hole 122 is formed which is connected to the storage chamber 121 and introduces the cleaning solution to the storage chamber 121. To the introduction hole 122, the supply pipe 61 (see FIG. 1) for the cleaning solution is connected. One introduction hole 122 is provided for one storage chamber 121 in the example in FIG. 3. The number of the introduction holes 122 for one storage chamber 121 may be plural (for example, two to five) as long as the number of the introduction holes 122 is less than the total number of the discharge ports 120.

The cleaning solution supplied to the storage chamber 121 via the supply pipe 61 and the introduction hole 122 is discharged from each discharge port 120. The cleaning solution discharged from each discharge port 120 flows down along the inclined surface 112 of the inner cup 110 to which the resist solution adheres. This removes the resist adhering to the inclined surface 112. In other words, the inclined surface 112 is cleaned.

A discharge direction Dt of the cleaning solution from each discharge port 120 in plan view is the outside in the radial direction passing through the discharge port 120. Note that the discharge direction Dt may be parallel to a radial direction Dr or may be a direction having an angle $\alpha$ ($\alpha>0°$) with respect to the radial direction Dr as illustrated in FIG. 5. By setting the discharge direction to the direction having the angle $\alpha$ with respect to the radial direction Dr, the cleaning solution can be uniformly supplied in the circumferential direction of the cup 30 on the outer peripheral edge side of the inclined surface 112 of the inner cup 110. Accordingly, it is possible to further reduce the possibility that the resist solution remains while adhering to the inclined surface 112 of the inner cup 110.

Further, as illustrated in FIG. 4, a discharge direction Ds of the cleaning solution from each discharge port 120 in side view is obliquely upward. In other words, the discharge direction Ds is a direction having an angle $\beta$ ($\beta>0°$) with respect to a horizontal direction Dh.

According to the earnest study by the present inventors, when the discharge direction Ds is horizontal, the resist solution has sometimes remained in a stripe shape along the radial direction on the outer peripheral edge side of the inclined surface 112 of the inner cup 110 after a predetermined amount of the cleaning solution was discharged from the discharge port 120 to perform cleaning. This seems to be because when the discharge direction Ds is horizontal, the cleaning solution discharged from the discharge port 120 comes into contact with the inclined surface 112 just after the discharge and is thus likely to be influenced by the surface energy of the inclined surface 112.

When the cleaning solution discharged from the discharge port 120 is not in contact with the inclined surface 112 just after the discharge but is apart from the inclined surface 112 unlike the above, the cleaning solution spreads in the circumferential direction in a space above the inclined surface 112 and then collides with the inclined surface 112, and thereafter flows along the radial direction. In this case, as illustrated in FIG. 6, a region R1 of the inclined surface 112 to which the cleaning solution from each discharge port 120 is supplied is wide on the outer peripheral edge side of the inclined surface 112. In contrast to this, when a cleaning solution discharged from the discharge port 120 comes into contact with the inclined surface 112 just after the discharge, the cleaning solution does not spread in the circumferential direction of the cup 30 but flows, as it is, along the radial direction of the cup on the inclined surface 112. In this case, as illustrated in FIG. 7, a region R2 of the inclined surface 112 to which the cleaning solution from each discharge port 120 is supplied is narrow on the outer peripheral edge side of the inclined surface 112. Therefore, it is considered that a region where the supply of the cleaning solution is insufficient occurs in a stripe shape along the radial direction on the outer peripheral edge side of the inclined surface 112 and, as a result of this, the resist solution remains in a stripe shape.

Hence, the discharge direction Ds is set to be obliquely upward in this embodiment.

Next, an example of the resist coating treatment in the resist coating apparatus 1 will be explained. The following series of treatments is performed under the control of the controller U.

In the resist coating treatment, first, the wafer W is suction-held on the upper surface of the spin chuck 20. Then, the discharge nozzle 42 is moved to a position above the center portion of the wafer W. Subsequently, the wafer W is rotated at a low number of rotations (for example, 100 rpm), and the resist solution is supplied onto the wafer W from the discharge nozzle 42 during the rotation.

At the point in time when the supply amount of the resist solution from the discharge nozzle 42 reaches a predetermined amount, the supply of the resist solution is stopped, and then the discharge nozzle 42 is retracted. Thereafter, the wafer W is rotated at a higher number of rotations (for example, 3000 rpm), and thereby the resist solution supplied to the center portion of the wafer W is diffused over the entire surface of the wafer W to form a coating film with a predetermined film thickness. Then, the wafer W is rotated at a predetermined number of rotations (for example, 1000 rpm), and thereby the coating film on the wafer W is dried.

Thereafter, the wafer W suction-held on the spin chuck 20 is transferred out of the resist coating apparatus 1. With this, the series of treatments relating to the resist coating treatments is completed.

Subsequently, an example of the cleaning treatment in the resist coating apparatus 1 will be explained.

The following cleaning treatment is performed under the control of the controller U. Note that the cleaning treatment is executed, for example, in parallel with the resist coating treatment. Further, the cleaning treatment may be executed every time the number of the wafers W on which the resist coating treatment has been performed, namely, the number of treated wafers exceed a fixed number or a fixed time has elapsed, or may be executed at maintenance.

In the cleaning treatment, the supply of the cleaning solution to the storage chamber 121 is started, and the discharge of the cleaning solution from all of the discharge ports 120 is started. The discharge flow rate of the cleaning solution from the discharge ports 120 at this time is, for example, 100 ml/min to 1000 ml/min. The cleaning solution discharged from each discharge port 120 spreads along the circumferential direction in the space above the inclined surface 112 and then collides with the peripheral edge side of the inclined surface 112, and thereafter flows along the radial direction on the inclined surface 112 as explained above. Therefore, the cleaning solution is supplied to the entire peripheral edge side of the inclined surface 112 to completely remove the resist solution adhering to the peripheral edge side of the inclined surface 112.

At the point in time when the discharge time of the cleaning solution from the discharge ports 120 reaches a predetermined time (for example, 5 seconds to 300 seconds), the supply of the cleaning solution to the storage chamber 121 is stopped, with which the cleaning treatment is completed.

As explained above, in this embodiment, a plurality of the discharge ports 120 discharging the cleaning solution outward in the radial direction are provided along the circumferential direction at the apex part 113 of the inner cup 110. Further, the discharge direction of the cleaning solution from each discharge port 120 is obliquely upward. Therefore, the cleaning solution discharged from each discharge port 120 flies in a manner to be apart from the inclined surface 112 of the inner cup 110, and therefore is not influenced by the surface energy of the inclined surface 112. Accordingly, the cleaning solution discharged from the discharge ports 120 spreads in the circumferential direction in the space above the inclined surface 112 and then flows on the inclined surface 112. Therefore, it is possible to supply the cleaning solution in the entire region on the outer peripheral edge side being a region to which the resist solution mainly adheres on the inclined surface 112, and completely remove the resist solution from the inclined surface 112. In other words, according to this embodiment, it is possible to appropriately remove the coating solution adhering to the inclined surface 112 of the inner cup 110 by cleaning.

Second Embodiment

Figure 8:
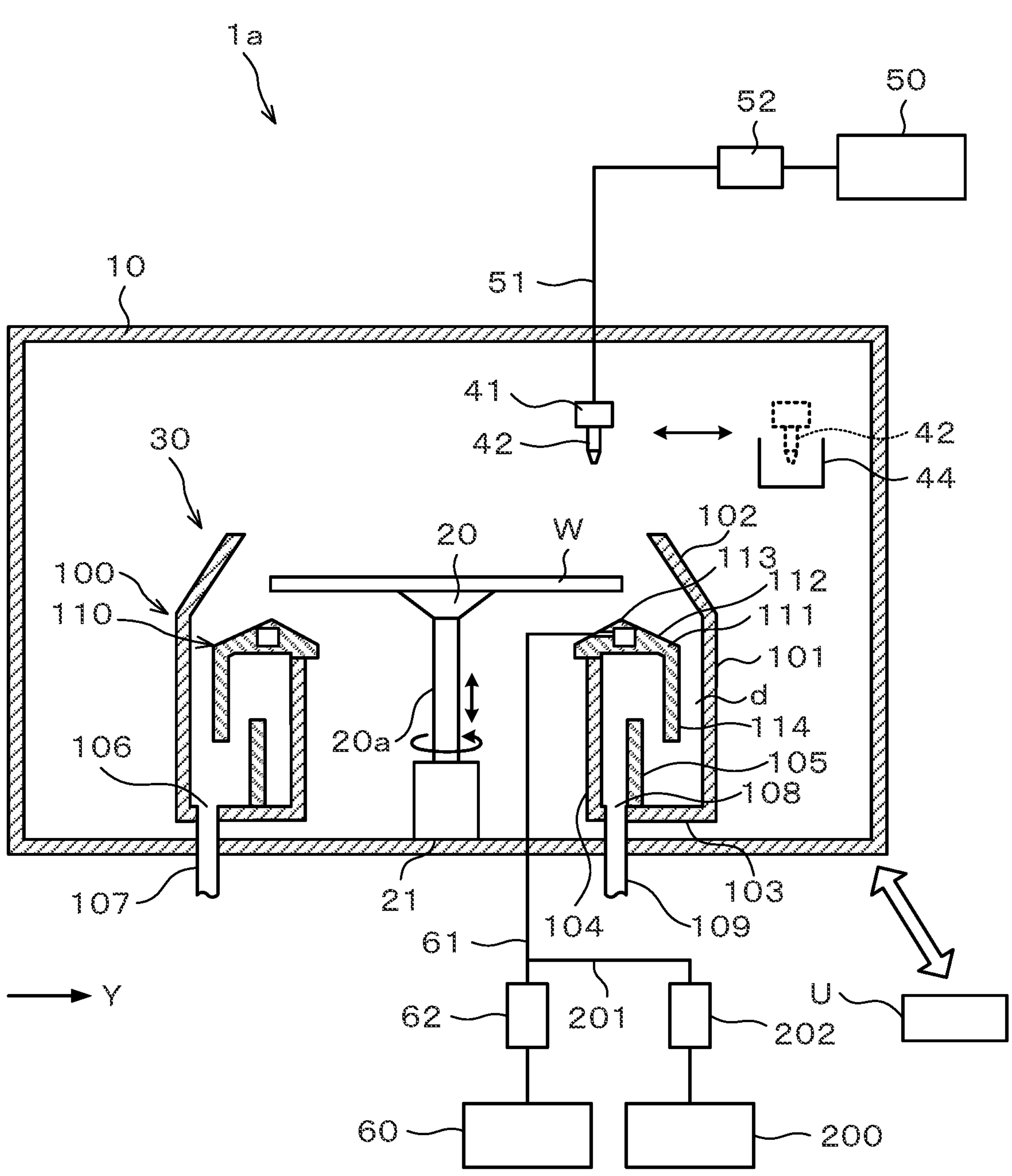
FIG. 8 is a longitudinal sectional view schematically illustrating the configuration of a resist coating apparatus as a solution treatment apparatus according to a second embodiment.

FIG. 8 is a longitudinal sectional view schematically illustrating the configuration of a resist coating apparatus as a solution treatment apparatus according to a second embodiment.

In a resist coating apparatus 1*a* in FIG. 8, a supply pipe 201 communicating with a supply source 200 storing a nitrogen (N 2) gas as an inert gas is connected to the supply pipe 61. More specifically, not only the cleaning solution but also the nitrogen gas are introduced to the storage chamber 121 (see FIG. 3 and so on) via the introduction hole 122 (see FIG. 3 and so on) connected to the supply pipe 61.

The supply pipe 201 is provided with a supply equipment group 202 including a valve for controlling the flow of the nitrogen gas, a flow regulator for regulating the flow rate of the nitrogen gas, and so on. The supply equipment group 202 is controlled by the controller U.

FIG. 9 to FIG. 14 are timing charts for explaining supply examples of the cleaning solution and the nitrogen gas.

Supply Example 1 of the Cleaning Solution and the Nitrogen Gas

Figure 9:
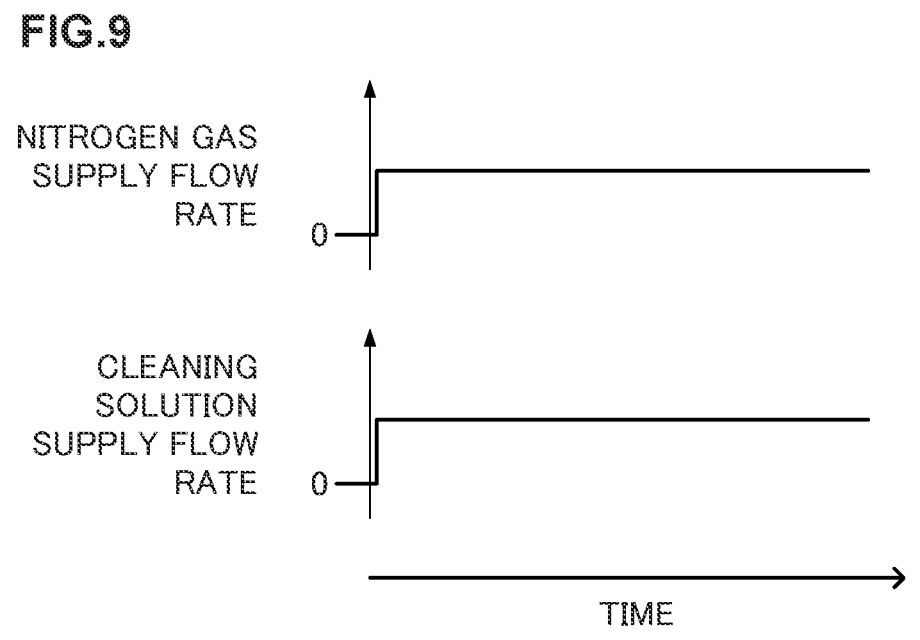

For example, the supply of the cleaning solution to the storage chamber 121 and the supply of the nitrogen gas to the storage chamber 121 are performed at the same time as illustrated in FIG. 9 under the control of the controller U. At that time, both of the supply flow rate of the cleaning solution to the storage chamber 121 and the supply flow rate of the nitrogen gas to the storage chamber 121 are made constant under the control of the controller U.

By supplying the cleaning solution and the nitrogen gas to the storage chamber 121 at the same time as explained above, the cleaning solution can be discharged from the discharge ports 120 (see FIG. 3 and so on) at a higher flow velocity. As the moving distance in the space above the inclined surface 112 is longer, the cleaning solution discharged from the discharge ports 120 spreads more widely in the circumferential direction and then collides with the inclined surface 112 of the inner cup 110. Further, when the flow velocity is higher as explained above, the cleaning solution discharged from the discharge ports 120 moves farther in the space above the inclined surface 112. Accordingly, by supplying the nitrogen gas together with the cleaning solution to the storage chamber 121, the cleaning solution can be supplied from each discharge port 120 to a wider region regarding the circumferential direction to the outer peripheral edge side of the inclined surface 112.

Supply Example 2 of the Cleaning Solution and the Nitrogen Gas

Figure 10:
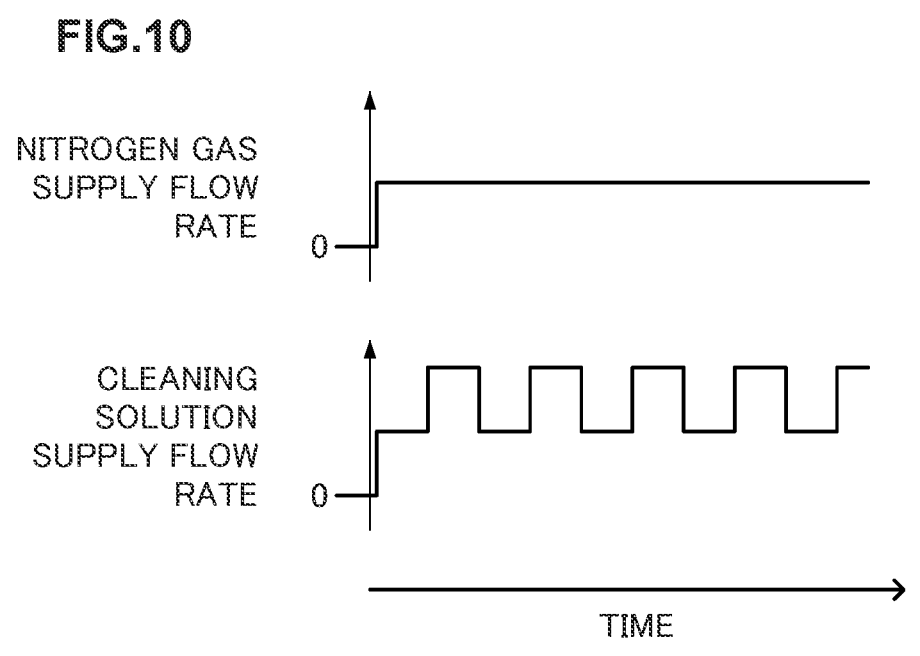

In this example, the supply of the cleaning solution to the storage chamber 121 and the supply of the nitrogen gas to the storage chamber 121 are performed at the same time as in the supply example 1, and the supply flow rate of the nitrogen gas to the storage chamber 121 is constant. However, in this example, the supply flow rate of the cleaning solution to the storage chamber 121 is alternately switched between a high flow rate and a low flow rate as illustrated in FIG. 10, concretely, as follows.

In the case where the supply of the cleaning solution and the supply of the nitrogen gas are performed at the same time as in the supply example 1 and the supply example 2, even if the supply flow rate of the cleaning solution is constant, a peak of the flow velocity of the cleaning solution discharged from the discharge ports 120 occurs in a predetermined cycle (every timing when the amount of the cleaning solution in the storage chamber 121 becomes maximum). In this example, the supply flow rate of the cleaning solution to the storage chamber 121 is switched to the high flow rate at a timing when the peak of the flow velocity of the cleaning solution discharged from the discharge ports 120 occurs, namely, at a timing when the discharge of the cleaning solution from the discharge ports 120 occurs. Further, after that, at a timing when the discharge of the cleaning solution from the discharge ports 120 is stopped or at a timing when the discharge of the cleaning solution from the discharge ports 120 becomes a predetermined flow rate or less, the supply flow rate of the cleaning solution to the storage chamber 121 is switched to the low flow rate.

In the case where the supply of the cleaning solution and the supply of the nitrogen gas are performed at the same time as in the supply example 1 and the supply example 2, a flow rate interference occurs between the supply flow rate of the cleaning solution and the supply flow rate of the nitrogen gas, and the flow velocity at the peak time of the cleaning solution discharged from the discharge ports 120 lowers, thus possibly resulting in that the flow rate of the cleaning solution discharged from the discharge ports 120 at the peak time decreases. In contrast to this, in the supply example 2, the supply flow rate of the cleaning solution to the storage chamber 121 becomes the high flow rate at the timing when the peak of the flow velocity of the cleaning solution discharged from the discharge ports 120 occurs, thus making it possible to prevent the decrease in the flow rate of the cleaning solution discharged from the discharge ports 120 at the peak time.

Supply Example 3 of the Cleaning Solution and the Nitrogen Gas

Figure 11:
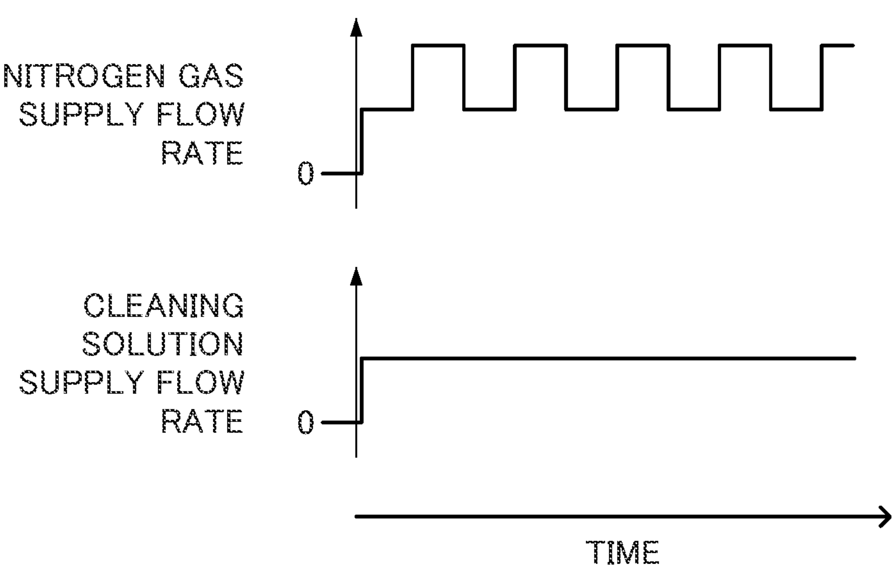
FIG. 11 is a timing chart for explaining a supply example of the cleaning solution and the nitrogen gas.

In this example, the supply of the cleaning solution to the storage chamber 121 and the supply of the nitrogen gas to the storage chamber 121 are performed at the same time as in the supply example 1, and the supply flow rate of the cleaning solution to the storage chamber 121 is constant. However, in this example, the supply flow rate of the nitrogen gas to the storage chamber 121 is alternately switched between a high flow rate and a low flow rate as illustrated in FIG. 11, concretely, as follows.

In this example, the supply flow rate of the nitrogen gas to the storage chamber 121 is switched to the high flow rate at a timing when the peak of the flow velocity of the cleaning solution discharged from the discharge ports 120 occurs, namely, at a timing when the discharge of the cleaning solution from the discharge ports 120 occurs. Further, after that, at a timing when the discharge of the cleaning solution from the discharge ports 120 is stopped or the like, the supply flow rate of the nitrogen gas to the storage chamber 121 is switched to the low flow rate.

In the supply example 3, the supply flow rate of the nitrogen gas to the storage chamber 121 becomes the high flow rate at the timing when the peak of the flow velocity of the cleaning solution discharged from the discharge ports 120 occurs, thus making it possible to prevent the decrease in the flow rate of the cleaning solution discharged from the discharge ports 120 at the peak time.

Supply Example 4 of the Cleaning Solution and the Nitrogen Gas

Figure 12:
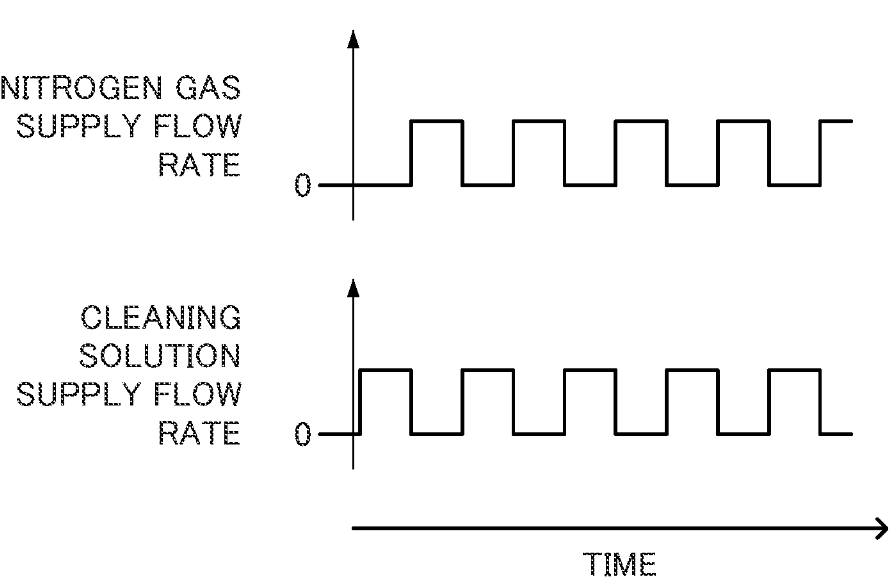
FIG. 12 is a timing chart for explaining a supply example of the cleaning solution and the nitrogen gas.

In this supply example, the supply of the cleaning solution to the storage chamber 121 and the supply of the nitrogen gas to the storage chamber 121 are alternately performed as illustrated in FIG. 12 under the control of the controller U. In this event, the supply pressure of the nitrogen gas is made higher than the supply pressure of the cleaning solution under the control of the controller U. In addition to this, both of the supply flow rate of the cleaning solution to the storage chamber 121 and the supply flow rate of the nitrogen gas to the storage chamber 121 are made constant under the control of the controller U.

By alternately performing the supply of the cleaning solution to the storage chamber 121 and the supply of the nitrogen gas to the storage chamber 121 and setting the supply pressure of the nitrogen gas high as in this example, the cleaning solution can be discharged from the discharge ports 120 at the higher flow velocity. Further, by alternately performing the supplies as in this example, the above flow rate interference does not occur, thus making it possible to discharge the cleaning solution from the discharge ports 120 efficiently and at the high flow rate.

Supply Example 5 of the Cleaning Solution and the Nitrogen Gas

Figure 13:
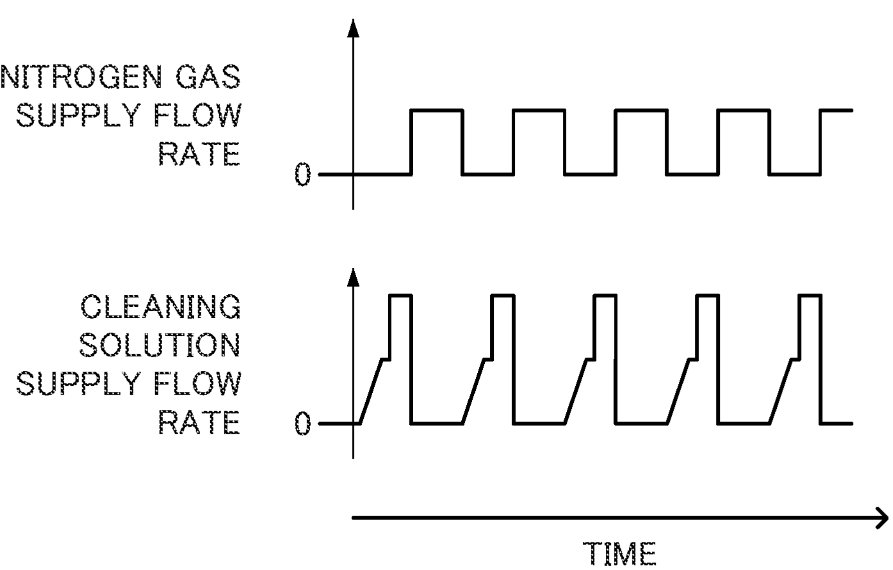
FIG. 13 is a timing chart for explaining a supply example of the cleaning solution and the nitrogen gas.

In this example, the supply of the cleaning solution to the storage chamber 121 and the supply of the nitrogen gas to the storage chamber 121 are alternately performed and the supply flow rate of the nitrogen gas to the storage chamber 121 is constant as in the supply example 4. However, in this example, the supply flow rate of the cleaning solution to the storage chamber 121 is varied as illustrated in FIG. 13. More specifically, the supply flow rate of the cleaning solution is set to the low flow rate until after a lapse of a predetermined time after the switch from the supply of the nitrogen gas to the supply of the cleaning solution, and is then gradually increased. This can prevent the cleaning solution from flowing back to the supply pipe 201 communicating with the supply source 200 of the nitrogen gas. Further, the supply flow rate of the cleaning solution is set to the high flow rate in a second half at a supply stage of the cleaning solution. This can eliminate air bubbles in the storage chamber 121 of the inner cup 110.

Supply Example 6 of the Cleaning Solution and the Nitrogen Gas

Figure 14:
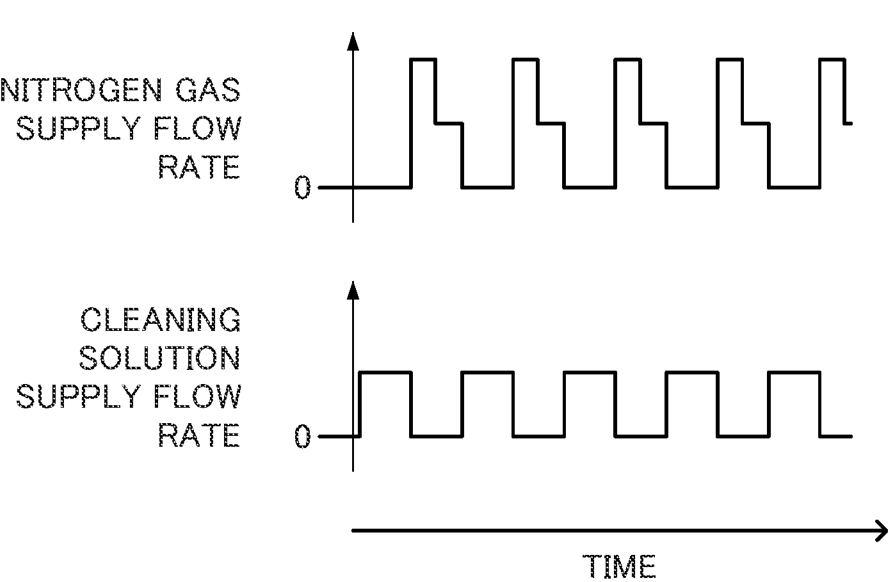
FIG. 14 is a timing chart for explaining a supply example of the cleaning solution and the nitrogen gas.

In this example, the supply of the cleaning solution to the storage chamber 121 and the supply of the nitrogen gas to the storage chamber 121 are alternately performed and the supply flow rate of the cleaning solution to the storage chamber 121 is constant as in the supply example 4. However, in this example, the supply flow rate of the nitrogen gas to the storage chamber 121 is varied as illustrated in FIG. 14. More specifically, the supply flow rate of the nitrogen gas is set to the high flow rate in a first half at a supply stage of the nitrogen gas and set to the low flow rate in a second half.

In the case where the supply of the cleaning solution and the supply of the nitrogen gas are alternately performed as in the supply example 4 to the supply example 6, a solution film of the cleaning solution may be formed at the opening at the tip end of the discharge port 120 at the last of the supply stage of the nitrogen gas. If the supply of the nitrogen gas is performed in a state where the solution film of the cleaning solution is formed, droplets of the cleaning solution are released from the discharge port 120 and float in the housing 10. The floating droplets of the cleaning solution possibly adversely affect the coating film of the resist solution on the wafer W when the cleaning treatment and the resist coating treatment are performed in parallel or the like.

In contrast to the above, the supply flow rate of the nitrogen gas is set to the low flow rate in the second half of the supply stage of the nitrogen gas as explained above in this example. Therefore, even if a solution film of the cleaning solution is formed at the opening at the tip end of the discharge port 120 at the last of the supply stage of the nitrogen gas and droplets of the cleaning solution are generated, the generated droplets of the cleaning solution increase in particle diameter. Therefore, the droplets of the cleaning solution never float in the housing 10 for a long time. As a result of this, it is possible to decrease the possibility that the droplets of the cleaning solution scattered from the discharge port 120 influence the coating film of the resist solution on the wafer W.

Further, that the supply flow rate of the nitrogen gas is set to the high flow rate in the first half of the supply stage of the nitrogen gas as in this example means that the supply flow rate of the nitrogen gas is set to the high flow rate in the first half of the discharge stage of the cleaning solution from the discharge ports 120. Further, in the first half of the discharge stage of the cleaning solution from the discharge ports 120, the cleaning solution is discharged at the high flow rate. In the first half of the discharge stage of the cleaning solution in which the cleaning solution is discharged at the high flow rate, the supply flow rate of the nitrogen gas is set to the high flow rate and the flow velocity of the cleaning solution discharged from the discharge ports 120 is increased, thereby making it possible to supply a larger amount of the cleaning solution to a wider region on the outer peripheral edge side of the inclined surface 112. In other words, the supply distribution of the cleaning solution can be further improved.

Modification Example of the Inner Cup

Figure 15:
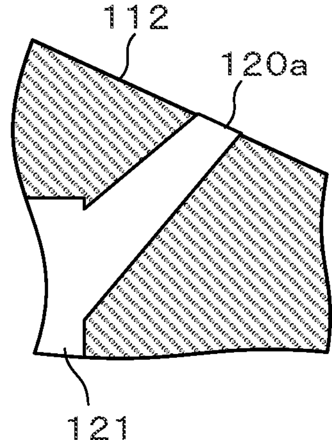
FIG. 15 is a partial enlarged sectional view for explaining another example of the discharge port.

FIG. 15 is a partial enlarged sectional view for explaining another example of the discharge port.

The flow path constituting each discharge port 120 is columnar in the above examples. In other words, the flow path constituting each discharge port 120 has a uniform thickness from the base end to the tip end. Instead of this, a flow path constituting each discharge port 120*a* may be narrower at the tip end than at the base end side as illustrated in FIG. 15. This makes it possible to discharge the cleaning solution from each discharge port 120*a* at a higher flow velocity.

Further, in the above example, the thickness of the flow path constituting the discharge port 120 is common among the discharge ports 120 in the above examples. Instead of this, the thickness of the flow path constituting the discharge port 120 may be made different according to the distance from the discharge port 120 to the introduction hole 122. More specifically, the thickness of the flow path constituting the discharge port 120 may be made larger as the distance from the discharge port 120 to the introduction hole 122 is longer. This can make the flow velocity at the discharge time higher also from the discharge port 120 which is located at a long distance to the introduction hole 122 and where the discharge pressure, namely, the flow velocity at the discharged time is likely to be lower. Accordingly, the flow velocity of the cleaning solution discharged from the discharge port 120 can be made uniform among the discharge ports 120. As a result of this, the possibility that unevenness occurs in the supply distribution of the cleaning solution to the inclined surface 112 can be further reduced.

Besides, the obliquely upward discharge angle of the cleaning solution by the discharge port 120 may be made different according to the distance from the discharge port 120 to the introduction hole 122. More specifically, the obliquely upward discharge angle of the cleaning solution by the discharge port 120 may be made larger as the distance from the discharge port 120 to the introduction hole 122 is longer.

The discharge port 120 located at a longer distance to the introduction hole 122 is more likely to be low in discharge pressure, namely, in flow velocity at the discharge time, and the discharged cleaning solution is thus easily influenced by the surface energy of the inclined surface 112. In contrast to this, by making the obliquely upward discharge angle of the cleaning solution larger for the discharge port 120 located at the longer distance to the introduction hole 122 as in this example, even the cleaning solution discharged from the discharge port 120 located at the longer distance to the introduction hole 122 is less influenced by the surface energy. Accordingly, the size of the region where each discharge port 120 supplies the cleaning solution to the outer peripheral edge side of the inclined surface 112 can be made uniform among the discharge ports 120. As a result of this, it is possible to further reduce the possibility that the unevenness occurs in the supply distribution of the cleaning solution to the inclined surface 112.

Figure 16:
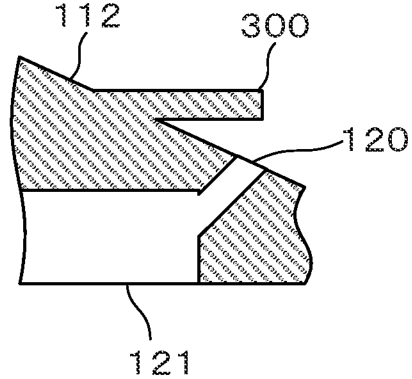
FIG. 16 is a partial sectional view illustrating the outline of the configuration of another example of the inner cup.

FIG. 16 is a partial sectional view illustrating the outline of the configuration of another example of the inner cup.

As explained above, the droplets of the cleaning solution may be released from the discharge port 120. To prevent the diffusion of the droplets of the cleaning solution, a shielding plate 300 may be provided at the inclined surface 112. More specifically, the shielding plate 300 is intended to prevent the diffusion of the droplets of the cleaning solution released from the discharge port 120 to the inner peripheral side of the discharge port 120. The shielding plate 300 is, for example, formed to extend horizontally from a position above the discharge port 120 at the inclined surface 112. The length of the shielding plate 300 is a length at which a mass of the cleaning solution discharged from the discharge port 120 does not collide with the tip of the shielding plate 300 at normal times. Note that the "normal times" means a period when the release of the droplets of the cleaning solution is not generated.

Figure 17:
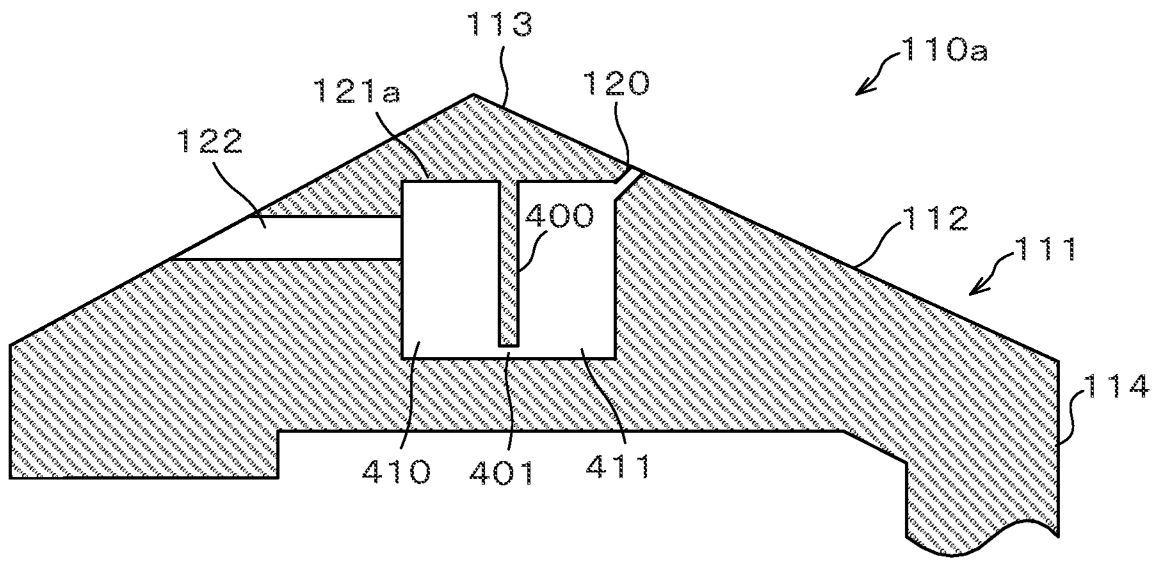
FIG. 17 is a partial sectional view illustrating the outline of the configuration of another example of the inner cup.
Figure 18:
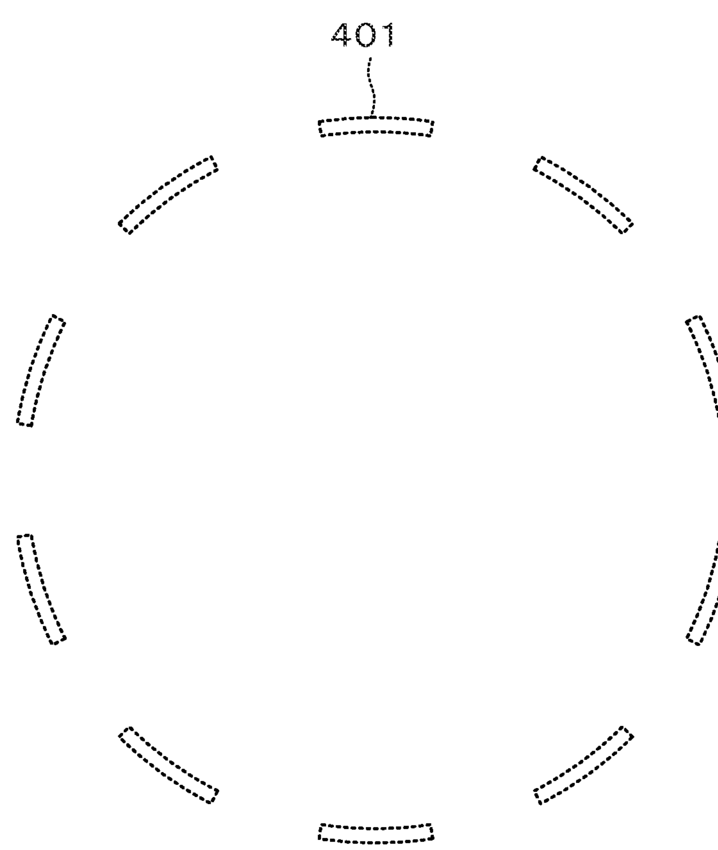
FIG. 18 is a view illustrating the outline of a communication hole.

FIG. 17 is a partial sectional view illustrating the outline of the configuration of another example of the inner cup. FIG. 18 is a view illustrating the outline of a later-explained communication hole.

A storage chamber 121*a* may be divided into two buffers 410, 411 in a circular shape in plan view along the circumferential direction by a partition wall 400 which partitions the inside of the storage chamber 121*a* into two regions along the flow of fluid as illustrated in FIG. 17.

In this case, the partition wall 400 is formed with a plurality of communication holes 401. The communication holes 401 allow the buffer 410 on the upstream side (hereinafter, referred to as a "primary buffer" in some cases) to communicate with the buffer 411 on the downstream side (hereinafter, referred to as a "secondary buffer" in some cases), the buffers being separated by the partition wall 400.

The communication hole 401 is formed, for example, in a slit shape long in the circumferential direction and short in the radial direction as illustrated in FIG. 18. Further, the communication hole 401 is provided at a predetermined interval over the entire circumference along the circumferential direction. Note that the number of the communication holes 401 is, for example, the number with which the total length of the communication holes 401 in the circumferential direction corresponds to 180° or more.

By providing the two buffers 410, 411 and providing the communication hole 401 at a predetermined interval over the entire circumference along the circumferential direction at the partition wall 400 separating the buffers 410, 411 as explained above, the following effects are provided. Specifically, the cleaning solution is supplied to the secondary buffer 411 communicating with the discharge ports 120 at a uniform pressure regarding the circumferential direction from the primary buffer 410. Therefore, the cleaning solution is discharged from the discharge ports 120 at a uniform pressure, namely, flow velocity regarding the circumferential direction. Accordingly, the cleaning solution can be supplied to the outer peripheral edge side of an inner cup 110*a* uniformly regarding the circumferential direction.

Figure 19:
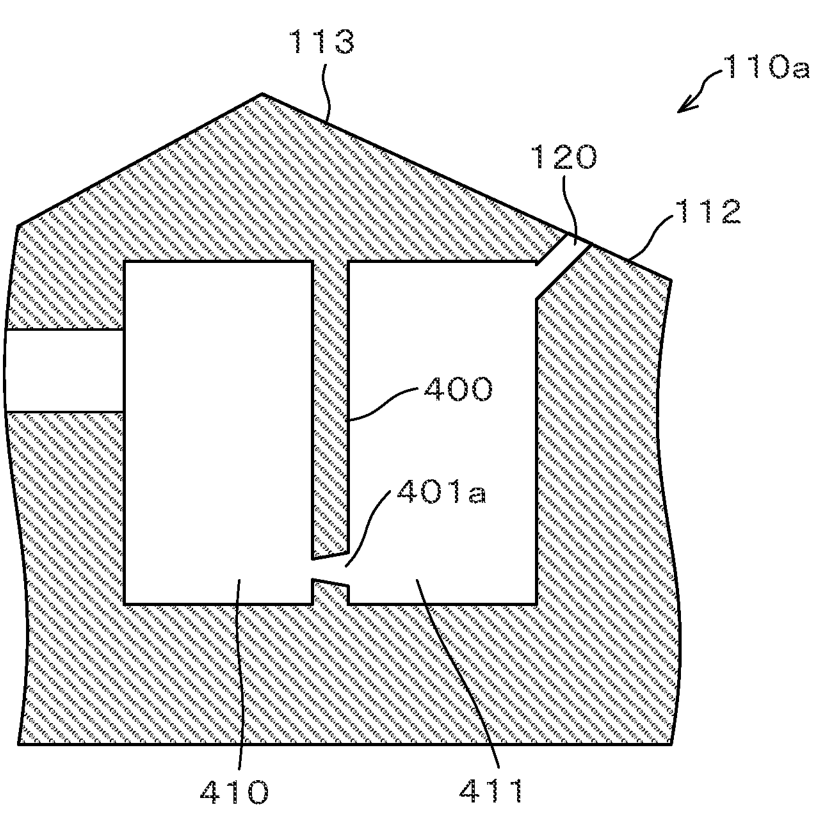
FIG. 19 is a view illustrating another example of the communication hole.

FIG. 19 is a view illustrating another example of the communication hole.

The shape of a communication hole 401*a* may be a truncated cone shape as illustrated in FIG. 19.

Also in the case of this shape, the communication hole 401*a* is provided at a predetermined interval over the entire circumference along the circumferential direction.

Figure 20:
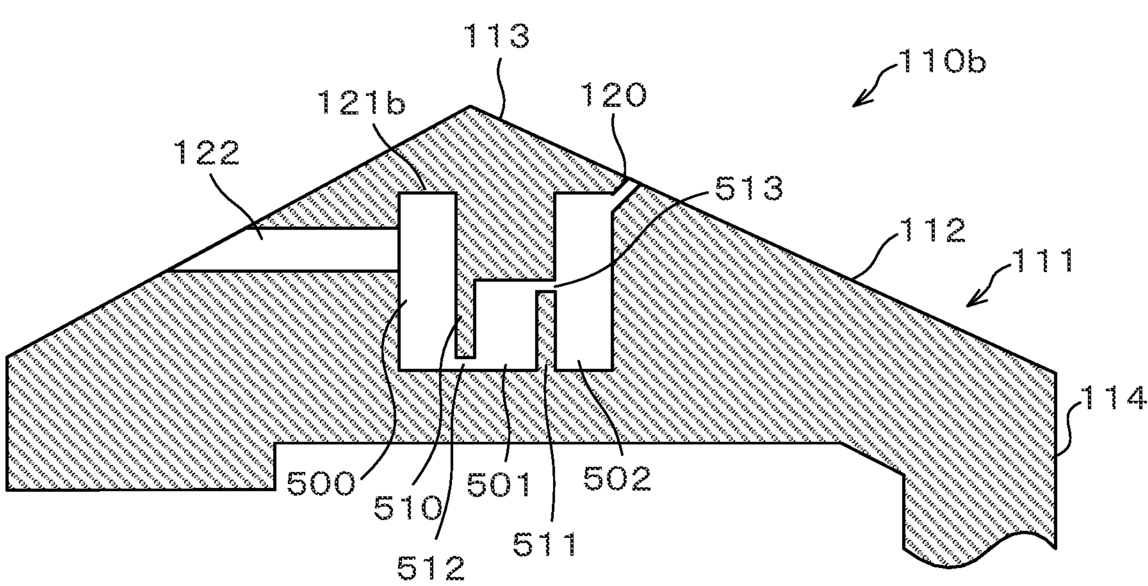
FIG. 20 is a partial sectional view illustrating the outline of the configuration of another example of the inner cup.

FIG. 20 is a partial sectional view illustrating the outline of the configuration of another example of the inner cup.

In the example in FIG. 18, the storage chamber 121*a* is divided into the two buffers 410, 411. The storage chamber is not limited to this example, but may be divided into three or more buffers. For example, in an inner cup 110*b* in FIG. 20, a storage chamber 121*b* is divided into three buffers 500 to 502, and the buffers 500 to 502 are stacked in the lateral direction of the drawing.

A partition wall 510 is provided between the buffer 500 on the most upstream side and the intermediate buffer 501, and a partition wall 511 is provided between the intermediate buffer 501 and the buffer 502 on the most downstream side. Further, the partition wall 510 is provided with a communication hole 512 allowing the buffer 500 to communicate with the buffer 501, and the partition wall 511 is provided with a communication hole 513 allowing the buffer 501 to communicate with the buffer 502. At least the communication hole 513 of the communication holes 512 and 513 is provided at a predetermined interval over the entire circumference along the circumferential direction of the cup 30 as with the communication hole 401 in FIG. 17. Note that the communication hole 512 is assumed to be formed in a circular shape in plan view in the following.

Further, it is preferable that penetration directions of the communication hole 512 and the communication hole 513 are not aligned on the same straight line. This is because the cleaning solution is supplied from the communication hole 513 to the buffer 502 on the most downstream side communicating with the discharge ports 120 at a higher pressure when they are aligned on the same straight line than when they are not aligned, resulting in that the discharge pressure of the cleaning solution from the discharge ports 120 is more nonuniform in the circumferential direction of the cup 30.

Further, it is preferable that an introduction direction of the cleaning solution to the storage chamber 121*b* by the introduction hole 122 and the penetration direction of the communication hole 512 provided in the partition wall 510 on the most upstream side are not aligned on the same straight line. This is because when they are aligned on the same straight line, the discharge pressure of the cleaning solution from the discharge port 120 closer to the introduction hole 122 may be higher than that from the other discharge port 120.

Similarly, when the number of buffers is two as in FIG. 17, it is preferable that the introduction direction of the cleaning solution to the storage chamber 121*a* by the introduction hole 122 and the penetration direction of the communication hole 401 are not aligned on the same straight line. This is because the cleaning solution is supplied to the secondary buffer 411 from the communication hole 401 penetrating in the direction aligned on the same straight line with the introduction direction of the cleaning solution by the introduction hole 122 at a higher pressure than that from the other communication hole 401, resulting in that the discharge pressure of the cleaning solution from the discharge ports 120 is nonuniform in the circumferential direction of the cup 30.

Figure 21:
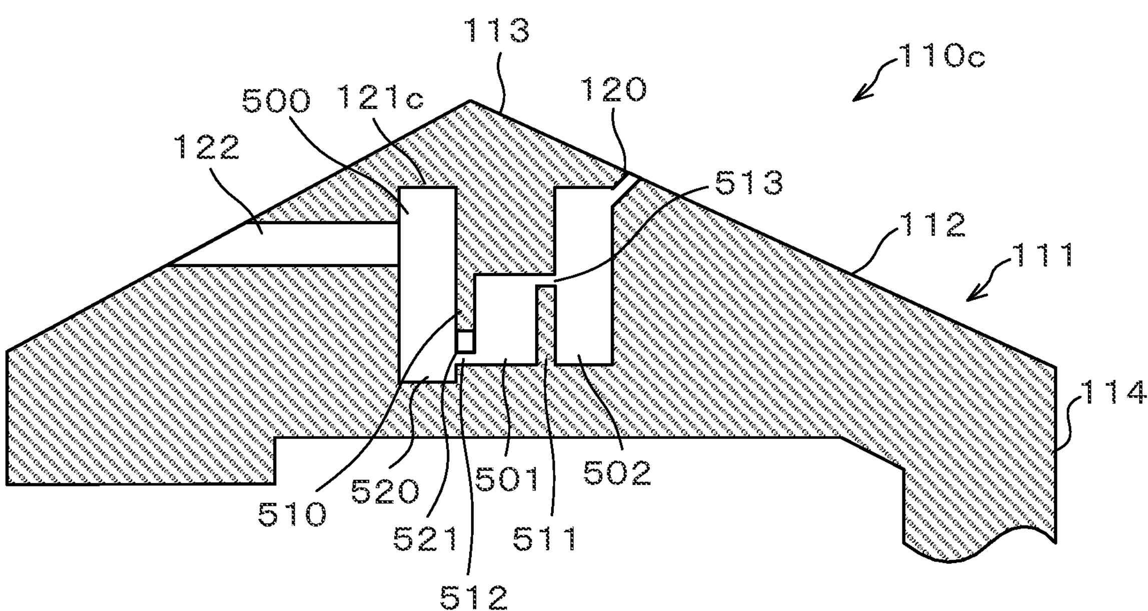
FIG. 21 is a partial sectional view illustrating the outline of the configuration of another example of the inner cup.

FIG. 21 is a partial sectional view illustrating the outline of the configuration of another example of the inner cup.

In an inner cup 110*c* in FIG. 21, a recessed part 520 recessed downward is formed at a bottom portion of the buffer 500 with which the nitrogen gas introduced into a storage chamber 121*c* collides when proceeding along the buffer 500 on the most upstream side. Therefore, the nitrogen gas introduced into the storage chamber 121*c* enters the recessed part 520 and decreases in flow velocity, and is then supplied to the buffer 501. Accordingly, it is possible to prevent the discharge pressure of the cleaning solution from the discharge ports 120 from becoming nonuniform in the circumferential direction due to the high flow velocity of the cleaning solution supplied to the buffer 501.

Further, in the inner cup 110*c* in FIG. 21, a recessed part 521 cut out so as to be recessed upward is formed at the lower end of the partition wall 510. The recessed part 521 is provided at a predetermined interval over the entire circumference along the circumferential direction of the cup 30.

By providing the recessed part 521, the nitrogen gas introduced into the storage chamber 121 escapes only from the recessed part 521. Therefore, the distribution of the nitrogen gas can be improved.

Note that unlike the above examples, a discharge port for the inert gas such as the nitrogen gas may be provided, in addition to the discharge port for the cleaning solution, on the upper side of the discharge port for the cleaning solution on the inclined surface 112 so as to assist the diffusion of the cleaning solution by the inert gas.

The embodiments disclosed herein are examples in all respects and should not be considered to be restrictive. Various omissions, substitutions and changes may be made in the embodiments without departing from the scope and spirit of the attached claims.

According to this disclosure, remaining the coating solution adhering to the inner cap, after the inner cup of the solution treatment apparatus is cleaned, is suppressed.

What is claimed is:

1. A cleaning method of cleaning a solution treatment apparatus for applying a coating solution onto a substrate,
the solution treatment apparatus comprising:
a holder configured to hold and rotate the substrate;
a coating solution supplier configured to supply the coating solution to the substrate held on the holder; and
an inner cup configured to surround the holder from a lateral side and having a peripheral edge side upper surface inclining down outward in a radial direction from an apex part located below a peripheral edge side of the substrate held on the holder,
the solution treatment apparatus comprising:
a plurality of discharge ports formed along a circumferential direction at the apex part;
a storage chamber provided in a circular shape along the circumferential direction inside the inner cup, communicating with each of the plurality of discharge ports, and configured to store the cleaning solution; and
an introduction hole connected to the storage chamber and configured to introduce the cleaning solution to the storage chamber;
the cleaning method comprising
introducing the cleaning solution to the storage chamber via the introduction hole,
discharging the cleaning solution from the plurality of discharge ports and making the cleaning solution flow down along the peripheral edge side upper surface of the inner cup, thereby cleaning away the coating solution adhering to the peripheral edge side upper surface,
the discharging in the cleaning discharges the cleaning solution from the plurality of discharge ports outward in the radial direction and obliquely upward,
wherein, in the solution treatment apparatus,
the storage chamber is divided into a plurality of buffers in a circular shape along the circumferential direction by a partition wall which partition an inside of the storage chamber into a plurality of regions along a flow of fluid; and
the partition wall is provided with a communication hole which allows the plurality of buffers separated by the partition wall to communicate with each other.

2. A cleaning method of cleaning a solution treatment apparatus for applying a coating solution onto a substrate,
the solution treatment apparatus comprising:
a holder configured to hold and rotate the substrate;
a coating solution supplier configured to supply the coating solution to the substrate held on the holder; and
an inner cup configured to surround the holder from a lateral side and having a peripheral edge side upper surface inclining down outward in a radial direction from an apex part located below a peripheral edge side of the substrate held on the holder,
the solution treatment apparatus comprising:
a plurality of discharge ports formed along a circumferential direction at the apex part;
a storage chamber provided in a circular shape along the circumferential direction inside the inner cup, communicating with each of the plurality of discharge ports, and configured to store the cleaning solution; and
an introduction hole connected to the storage chamber and configured to introduce the cleaning solution to the storage chamber;
the cleaning method comprising
introducing the cleaning solution to the storage chamber via the introduction hole,
discharging the cleaning solution from the plurality of discharge ports and making the cleaning solution flow down along the peripheral edge side upper surface of the inner cup, thereby cleaning away the coating solution adhering to the peripheral edge side upper surface,
the discharging in the cleaning discharges the cleaning solution from the plurality of discharge ports outward in the radial direction and obliquely upward,
wherein, in the solution treatment apparatus, for each discharge port of the plurality of discharge ports, a thickness of a flow path constituting each discharge port is larger as a respective distance from each discharge port to the introduction hole is longer.

3. A cleaning method of cleaning a solution treatment apparatus for applying a coating solution onto a substrate,
the solution treatment apparatus comprising:
a holder configured to hold and rotate the substrate;
a coating solution supplier configured to supply the coating solution to the substrate held on the holder; and
an inner cup configured to surround the holder from a lateral side and having a peripheral edge side upper surface inclining down outward in a radial direction from an apex part located below a peripheral edge side of the substrate held on the holder,
the solution treatment apparatus comprising:
a plurality of discharge ports formed along a circumferential direction at the apex part;
a storage chamber provided in a circular shape along the circumferential direction inside the inner cup, communicating with each of the plurality of discharge ports, and configured to store the cleaning solution; and
an introduction hole connected to the storage chamber and configured to introduce the cleaning solution to the storage chamber;
the cleaning method comprising introducing the cleaning solution to the storage chamber via the introduction hole, discharging the cleaning solution from the plurality of discharge ports and making the cleaning solution flow down along the peripheral edge side upper surface of the inner cup, thereby cleaning away the coating solution adhering to the peripheral edge side upper surface, the discharging in the cleaning discharges the cleaning solution from the plurality of discharge ports outward in the radial direction and obliquely upward, wherein, in the solution treatment apparatus, a respective obliquely upward discharge angle of the cleaning solution from the plurality of discharge ports at the discharging in the cleaning is larger as a respective distance from the plurality of discharge ports to the introduction hole is longer.

4. The cleaning method according to claim 3, wherein, in the solution treatment apparatus, in each of the plurality of discharge ports, a flow path is thinner at a tip end than at a base end side.

5. The cleaning method according to claim 3, wherein the discharging in the cleaning discharges the cleaning solution from the plurality of discharge ports in a direction having an angle with respect to a radial direction passing through the discharge port in plan view.

6. The cleaning method according to claim 3, wherein the solution treatment apparatus further comprises:

a shielding plate configured to prevent diffusion of the cleaning solution released in a droplet form from the plurality of discharge ports that is provided above the plurality of discharge ports.

7. The cleaning method according to claim 3, wherein, in the solution treatment apparatus, a thickness of a flow path constituting the discharge port is different depending on a distance from the plurality of discharge ports to the introduction hole.

8. The cleaning method according to claim 3, wherein, in the solution treatment apparatus, the storage chamber is divided into a plurality of buffers in a circular shape along the circumferential direction by a partition wall which partition an inside of the storage chamber into a plurality of regions along a flow of fluid; and the partition wall is provided with a communication hole which allows the plurality of buffers separated by the partition wall to communicate with each other.

9. The cleaning method according to claim 8, wherein, in the solution treatment apparatus, the partition wall is provided with a plurality of the communication holes along the circumferential direction.

10. The cleaning method according to claim 9, wherein, in the solution treatment apparatus, when a number of the buffers is three, penetration directions of the communication hole provided in the partition wall and a communication hole provided in another partition wall are not aligned on a same straight line.

11. The cleaning method according to claim 9, wherein, in the solution treatment apparatus, an introduction direction of the cleaning solution by the introduction hole and a penetration direction of the communication hole provided in the partition wall on a most upstream side are not aligned on a same straight line.

12. The cleaning method according to claim 3, wherein the cleaning also introduces an inert gas into the storage chamber via the introduction hole.

13. The cleaning method according to claim 12, wherein at the cleaning, a supply of the cleaning solution to the storage chamber and a supply of the inert gas to the storage chamber are performed at a same time; and a supply flow rate of the cleaning solution to the storage chamber and a supply flow rate of the inert gas to the storage chamber are constant.

14. The cleaning method according to claim 12, wherein at the cleaning, a supply of the cleaning solution to the storage chamber and a supply of the inert gas to the storage chamber are performed at a same time; and a supply flow rate of the inert gas to the storage chamber is constant and a supply flow rate of the cleaning solution to the storage chamber is alternately switched between a high flow rate and a low flow rate, the low flow rate being a non-zero flow rate lower than the high flow rate.

15. The cleaning method according to claim 12, wherein at the cleaning, a supply of the cleaning solution to the storage chamber and a supply of the inert gas to the storage chamber are performed at a same time; and a supply flow rate of the cleaning solution to the storage chamber is constant and a supply flow rate of the inert gas to the storage chamber is alternately switched between a high flow rate and a low flow rate, the low flow rate being a non-zero flow rate lower than the high flow rate.

16. The cleaning method according to claim 12, wherein at the cleaning, a supply of the cleaning solution to the storage chamber and a supply of the inert gas to the storage chamber are alternately performed; and a supply flow rate of the cleaning solution to the storage chamber and a supply flow rate of the inert gas to the storage chamber are constant.

17. The cleaning method according to claim 12, wherein at the cleaning, a supply of the cleaning solution to the storage chamber and a supply of the inert gas to the storage chamber are alternately performed; and a supply flow rate of the inert gas to the storage chamber is constant and a supply flow rate of the cleaning solution to the storage chamber is varied.

18. The cleaning method according to claim 12, wherein at the cleaning, a supply of the cleaning solution to the storage chamber and a supply of the inert gas to the storage chamber are alternately performed; and a supply flow rate of the cleaning solution to the storage chamber is constant and a supply flow rate of the inert gas to the storage chamber is varied.

* * * * *